United States Patent [19]

Wu

[11] 4,267,640

[45] May 19, 1981

[54] SYSTEM FOR ASCERTAINING MAGNETIC FIELD DIRECTION

[75] Inventor: Chin T. Wu, North Brunswick, N.J.

[73] Assignee: RCA Corporation, New York, N.Y.

[21] Appl. No.: 34,743

[22] Filed: Apr. 30, 1979

[51] Int. Cl.[3] ............................................. G01C 17/30
[52] U.S. Cl. ...................................... 33/361; 324/260
[58] Field of Search .................. 33/361, 362; 324/244, 324/247, 260, 263, 253

[56] References Cited

U.S. PATENT DOCUMENTS

| | | |
|---|---|---|
| 3,133,244 | 5/1964 | Wojtulewicz . |
| 3,573,610 | 4/1971 | Kesselring . |
| 3,601,899 | 8/1971 | Artz . |
| 3,678,593 | 7/1972 | Baker et al. ............................ 33/361 |
| 3,881,258 | 5/1975 | Iddings . |
| 3,936,949 | 2/1976 | Devand . |
| 3,952,420 | 4/1976 | Benjamin et al. . |
| 3,959,889 | 6/1976 | Thomas . |
| 3,971,981 | 7/1976 | Nakagome et al. ................... 33/361 |
| 4,030,204 | 6/1977 | Edwards . |

Primary Examiner—William D. Martin, Jr.

Attorney, Agent, or Firm—Samuel Cohen; Robert L. Troike; Donald W. Phillion

[57] ABSTRACT

A system for detecting magnetic field direction comprising a pair of orthogonally positioned rods each having a rectangular shaped BH curve, a switching winding, and detectors for detecting the switching of magnetic polarity of each rod to either of its remanent states. A switching current having a triangularly shaped waveform is supplied through said switching windings to drive said rods between their remanent states at times depending upon their angular relationship with the external magnetic field. Counters record the difference in time, measured from the immediately preceding zero current crossover points between the switching of each rod first to one of its remanent states and then to the other of said states. The time difference in one rod is proportional to the sine of the angle between the external field and said one rod and to the cosine of the angle between the external field and the other said other rod. The arc tangent of the ratio of the sine function to the cosine function is the angular relation of the external field to the rods.

10 Claims, 9 Drawing Figures

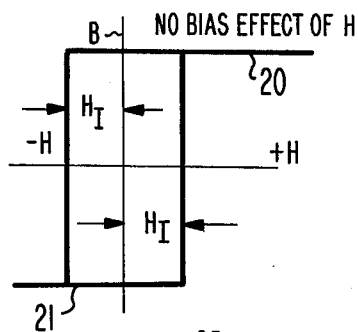

Fig. 1

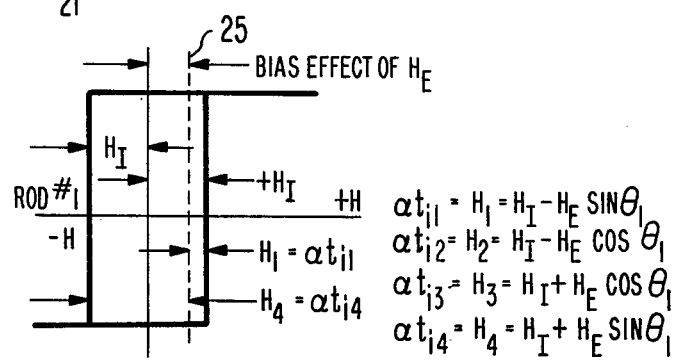

$$\alpha t_{i1} = H_1 = H_I - H_E \sin\theta_1$$
$$\alpha t_{i2} = H_2 = H_I - H_E \cos\theta_1$$
$$\alpha t_{i3} = H_3 = H_I + H_E \cos\theta_1$$
$$\alpha t_{i4} = H_4 = H_I + H_E \sin\theta_1$$

Fig. 2

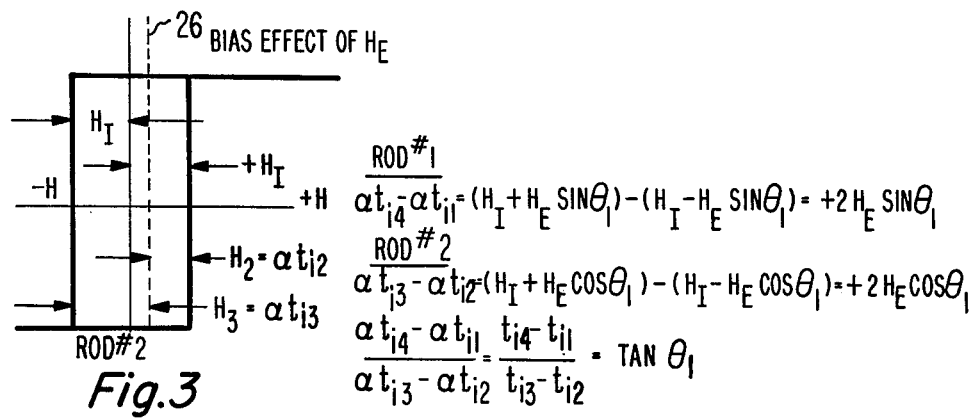

ROD #1
$$\alpha t_{i4} - \alpha t_{i1} = (H_I + H_E \sin\theta_1) - (H_I - H_E \sin\theta_1) = +2H_E \sin\theta_1$$

ROD #2
$$\alpha t_{i3} - \alpha t_{i2} = (H_I + H_E \cos\theta_1) - (H_I - H_E \cos\theta_1) = +2H_E \cos\theta_1$$

$$\frac{\alpha t_{i4} - \alpha t_{i1}}{\alpha t_{i3} - \alpha t_{i2}} = \frac{t_{i4} - t_{i1}}{t_{i3} - t_{i2}} = \tan\theta_1$$

Fig. 3

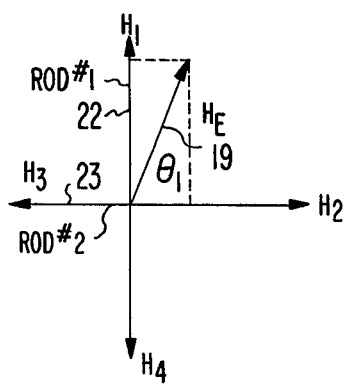

Fig. 4

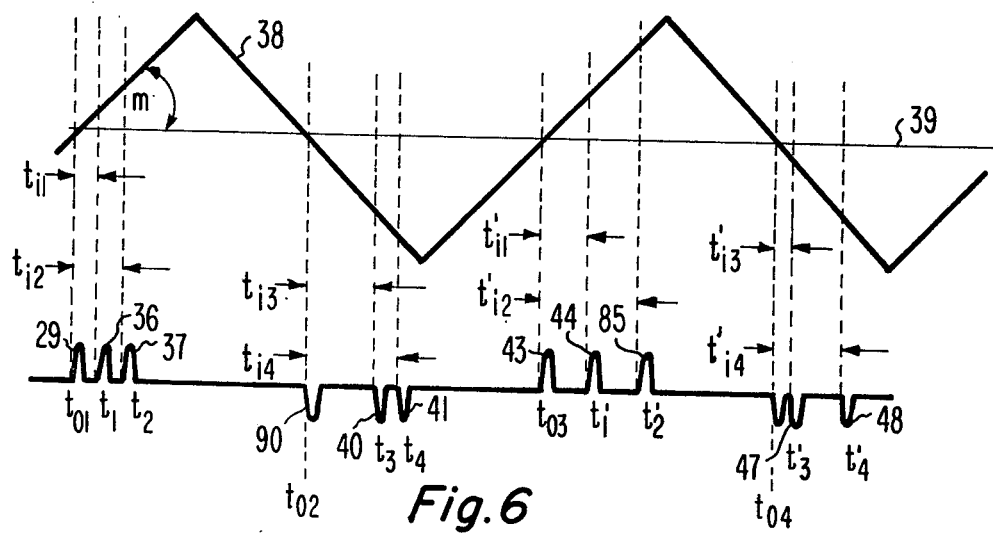

Fig.6

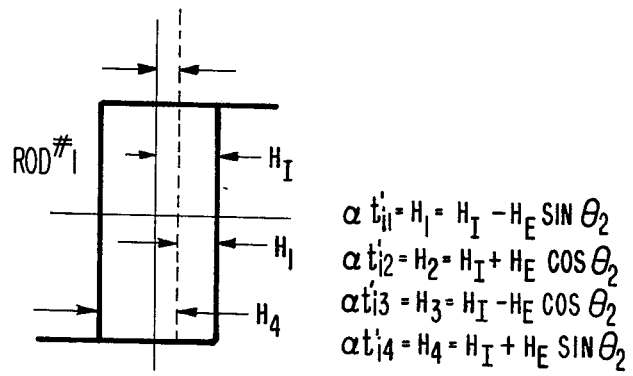

$\alpha t'_{i1} = H_1 = H_I - H_E \sin\theta_2$
$\alpha t'_{i2} = H_2 = H_I + H_E \cos\theta_2$
$\alpha t'_{i3} = H_3 = H_I - H_E \cos\theta_2$
$\alpha t'_{i4} = H_4 = H_I + H_E \sin\theta_2$

Fig.7

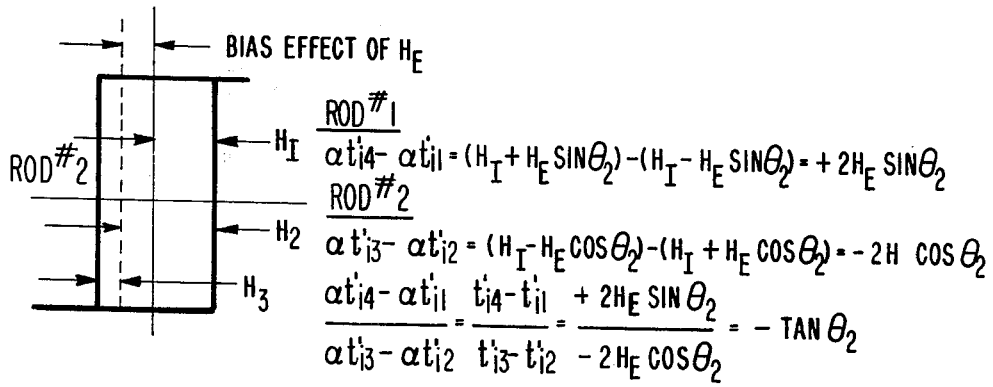

ROD #1
$\alpha t'_{i4} - \alpha t'_{i1} = (H_I + H_E \sin\theta_2) - (H_I - H_E \sin\theta_2) = +2H_E \sin\theta_2$ ROD #2
$\alpha t'_{i3} - \alpha t'_{i2} = (H_I - H_E \cos\theta_2) - (H_I + H_E \cos\theta_2) = -2H_E \cos\theta_2$ $$\frac{\alpha t'_{i4} - \alpha t'_{i1}}{\alpha t'_{i3} - \alpha t'_{i2}} = \frac{t'_{i4} - t'_{i1}}{t'_{i3} - t'_{i2}} = \frac{+2H_E \sin\theta_2}{-2H_E \cos\theta_2} = -\tan\theta_2$$

Fig.8

SYSTEM FOR ASCERTAINING MAGNETIC FIELD DIRECTION

SYSTEM FOR ASCERTAINING MAGNETIC FIELD DIRECTION

This invention relates generally to a means for detecting the direction of magnetic fields and more particularly, to a means for detecting the direction to the magnetic north pole without the use of moving parts.

The earth's magnetic field is about one-third to one-half Oersteds in intensity and its magnetic lines of force extend in the direction of the magnetic north pole. A means for detecting the direction of this field is the well-known magnetized needle compass. However, there are many disadvantages in using a magnetized needle compass. As examples, errors can be introduced by mechanical vibrations and the needle does not respond well to rapid changes in direction due to its mass. Further, because of friction between the needle and the frame, small changes are difficult to detect. Also, it is difficult to employ the mechanical indication of the needle in an electronic system.

The present invention overcomes the objections mentioned above.

In a preferred form of the invention there is provided a pair of orthogonally positioned rods each having a rectangularly shaped BH curve, each having a switching winding wound thereon and each provided with a means for sensing a change of magnetic polarity of magnetization thereof. An alternating current is passed through said switching windings to switch the polarity of magnetization of the rods between their upper and lower levels. Further means are provided to determine the ratio of the differences in magnitudes of positive and negative currents required to switch each rod between its upper and lower levels. Such ratio is the arc tangent of the angle between a selected one of the rods and the direction of the earth's magnetic field.

In the drawings:

FIG. 1 shows a typical BH curve of the rods employed in the invention without a magnetic biasing effect of the earth's magnetic field $H_E$;

FIG. 2 shows a BH curve of a first of the two crossed rods with the magnetic biasing of $H_E$ indicated in accordance with a given angular relationship between $H_E$ and the direction of the rod;

FIG. 3 shows the BH curve of the second of the two crossed rods with the magnetic biasing effect of $H_E$ and again assuming said given angular relationship with the direction of $H_E$;

FIG. 4 shows the two crossed rods in an angular relation $\Theta_1$ with the earth's magnetic field $H_E$;

FIG. 6 is a diagram of waveforms produced in the system of FIG. 5;

FIGS. 7 and 8 show the BH curves of the two crossed rods when in the presence of the earth's magnetic field with an angular relationship as shown in FIG. 9.

Figure 5:
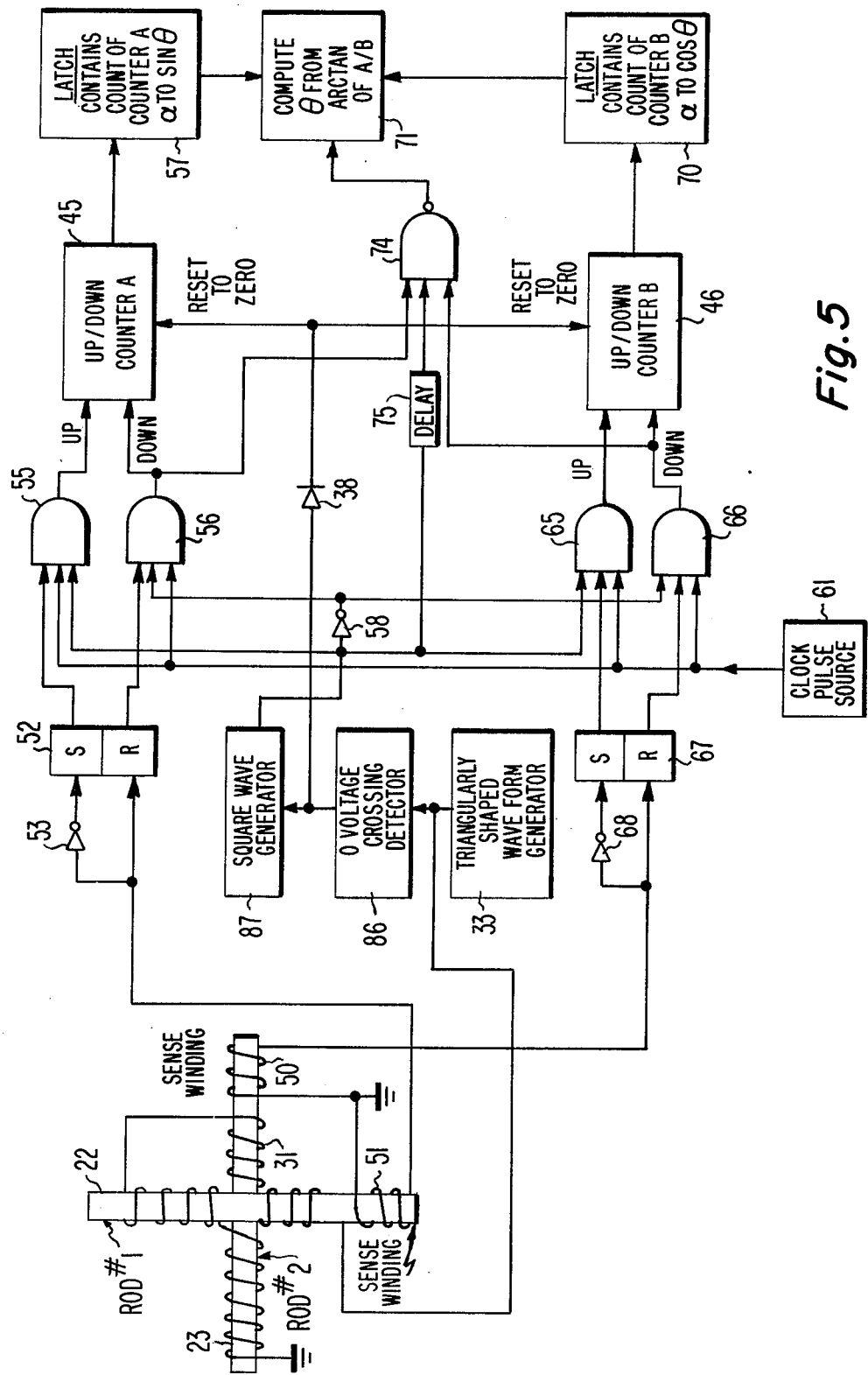
FIG. 5 is a block and schematic showing of a system embodying the invention.

Referring now to FIG. 1, it can be seen that in the absence of an external field an equal coercive force $H_I$ is required to drive the rod represented by the BH curve of FIG. 1 to its high level 20 or to its low level 21.

In FIGS. 2 and 3, however, there are shown BH curves of the two crossed rods when placed in the earth's magnetic field $H_E$ at an angle $\Theta_1$ with respect to rod 2, as indicated in FIG. 4. The rod 1 will be biased in the direction towards positive magnetization thereof, thus effectively moving the zero coercive force ordinate 28 to the position to the right represented by the dotted line 25. Thus, to switch the rod 1 to its positive remanent magnetization, also referred to herein as its upper level, from its negative remanent magnetization, also referred to herein as its lower level, only requires a coercive force equal to $H_1$, as shown in FIG. 2, which obviously requires considerably less current than would be the case where the earth's field were not assisting the switching.

However, to switch the rod 1 back to its lower level, a coercive force $H_4$ will be required since not only must the coercive force of the rod be overcome, but also the effect of the earth's magnetic field. Therefore, to switch the rod to its lower level will require a much larger current proportional to $H_4$ than is required to switch it to its upper level.

Specifically, referring to FIG. 4, in which the vectors 22 and 23 represent rods #1 and #2 and vector 19 the earth's field $H_E$, it can be seen that the coercive force $H_1$ required to switch rod 22 to its upper level is proportional to the unbiased coercive force of the rod $H_I$, less $H_E \sin \Theta_1$, which is the component of the earth's field aligned with rod 22. The coercive force $H_4$ required to switch the rod 22 back to its lower level is equal to $H_I + H_E \sin \Theta_1$.

The values of $H_1$ and $H_4$ are expressed as follows:

$$H_1 = H_I - H_E \sin \Theta_1 \quad \text{(a)}$$

$$H_4 = H_I + H_E \sin \Theta_1 \quad \text{(b)}$$

The difference between the two expressions (a) and (b) is:

$$H_4 - H_I = +2H_E \sin \Theta_1 \quad \text{(c)}$$

In a similar manner, by considering the BH curve of FIG. 3 and the vector diagram of FIG. 4, it will be seen that the expressions for $H_2$ and $H_3$ are as follows:

$$H_2 = H_I - H_E \cos \Theta_1 \quad \text{(d)}$$

$$H_3 = H_I + H_E \cos \Theta_1 \quad \text{(e)}$$

The difference between $H_3-H_2$ is then equal to:

$$H_3 - H_2 = +2H_E \cos \Theta_1 \quad \text{(f)}$$

The following relationship then exists:

$$\frac{+2H_E \sin \theta_1}{+2H_E \cos \theta_1} = \tan \theta_1 \quad \text{(g)}$$

Some means must now be employed to produce measured values which are proportional to $H_1$, $H_2$, $H_3$ and $H_4$. Such measured values can be obtained by the logic of FIG. 5 which includes means for driving the windings 30 and 31 of FIG. 5 by the triangularly shaped waveform of FIG. 6, generated by source 33 of FIG. 5. Because of the linear nature of the triangularly shaped waveform, the occurrences of switching of the rods 22 and 23 of FIG. 5 are proportional to a time reference such as a zero crossing of the triangularly shaped waveform. Thus, in FIG. 6, the triangularly shaped waveform 38 is shown crossing the zero axis line 39 in a positive going direction at time $t_{01}$ to produce the pulse 29 at the output of zero crossing detector 86 of FIG. 5. The second pulse 36, generated in sensing winding 51, occurs at time $t_1$, a time interval $t_{i1}$ after time $t_{01}$, and represents the positive going switching of rod 22 of FIG. 4. Since the triangular waveform 38 is linear and has a constant slope, the time interval $t_{i1}$ is proportional to the coercive force $H_1$ required to switch rod 1 of FIG. 4 to its upper level.

Similarly, the pulse 37 at $t_2$ in FIG. 6 is produced in sensing winding 50 by the switching of rod 23 to its upper level. The time interval $t_{i2}$ measured from $t_{01}$ is proportional to the coercive force $H_2$ required to switch the rod 23 of FIG. 4 to its upper level.

The triangularly shaped waveform 38 rises to a peak value 35 and then begins to decrease linearly passing across the zero axis line 39 at time $t_{02}$. At time $t_3$ the waveform 38 has become sufficiently negative to switch the rod 23 back to its lower level whereby the negative pulse 40 is produced. The time period $t_{i3}$ measured between $t_{02}$ and $t_3$ is proportional to the coercive force $H_3$ required to switch the rod 23 of FIG. 4 to its lower level.

At time $t_4$ the signal 38 has become sufficiently negative to switch the rod 22 to its lower level to produce the pulse 41. The time interval $t_{i4}$ is proportional to the coercive force $H_4$ required to switch the rod 22 to its lower level.

Thus, the pulses 36 and 41 occurring at times $t_1$ and $t_4$ represent the switching times of rod 22 of FIG. 4 first to its upper level and then to its lower level and the pulses 37 and 40 occurring at times $t_2$ and $t_3$ represent the switching times of the second rod 23 first to its upper level and then to its lower level, with all switching occurring in the presence of the earth's magnetic field $H_E$, as represented in the vector diagram of FIG. 4.

It is evident that the time interval $t_{i4} - t_{i1}$ is proportional to $2H_E \sin \Theta_1$ as shown in expression (c) above since $t_{i1}$ and $t_{i4}$ are respectively proportional to $H_1$ and $H_4$.

An up/down counter 45 of FIG. 5 is provided to measure the difference between the time periods $t_{i4}$ and $t_{i1}$. More specifically, by means of associated logic to be discussed below, the up/down counter 45 will count up during the period $t_{i1}$ and will count down during the period $t_{i4}$, with no counting in between the two time periods. The resultant count will be proportional to $2H_E \sin \Theta_1$ as indicated by the following expression:

$$\alpha t_{i4} - \alpha t_{i1} = (H_I + H_E \sin \Theta_1) - (H_I - H_E \sin \Theta_1) = \quad (h)$$
$$+2H_E \sin \Theta_1$$
where $\alpha$ is a constant.

Similarly, the up/down counter 46 of FIG. 5 functions to count up during the time period $t_{i2}$ and downward during the time period $t_{i3}$, with no counting in between, and thereby producing a resultant count which is proportional to the difference between the time interval $t_{i3}$ and $t_{i4}$ and proportional to $H_3 - H_2$ which, in turn, is proportional to $2H_E \cos \Theta_1$ in accordance with the following expression:

$$\alpha t_{i3} - \alpha t_{i2} = (H_I + H_E \cos \Theta_1) - (H_I - H_E \cos \Theta_1) = \quad (i)$$
$$+2H_E \cos \Theta_1$$

Expression (h) above divided by expression (i) results in the tangent of $\Theta_1$:

$$\frac{\alpha t_{i4} - t_{i1}}{\alpha t_{i3} - t_{i2}} = \frac{t_{i4} - t_{i1}}{t_{i3} - t_{i2}} = \frac{2H_E \sin \Theta_1}{2H_E \cos \Theta_1} = \text{TAN } \Theta_1 \quad (j)$$

The logic controlling the up/down counters 45 and 46 to count up and down during the various time intervals $t_{i1} - t_{i4}$ is shown in FIG. 5.

AND gates 55, 56, 65 and 66, each have three input terminals and control the counters 45 and 46 to supply pulses from clock pulse source 61 thereto through a first of the three inputs. The second input terminals receive their signals from flip-flops 52 and 67. The third input terminals of AND gates 55, 56, 65 and 66 receive their input signals from the square wave generator 87. The output of square wave generator 87 is derived from triangularly shaped waveform generator 33 and zero voltage crossing detector 86. Each time the triangularly shaped waveform of generator 33 crosses zero voltage in a negative direction, the zero voltage crossing detector 86 produces a negative pulse which drives the two-level output signal of generator 87 to its lower level. Each time the triangularly shaped waveform crosses zero voltage in a positive direction, the zero voltage crossing detector 86 produces a positive pulse which drives the output of generator 87 to its upper level. Also at each positive going zero voltage crossing of the triangularly shaped waveform, the counters 45 and 46 are reset to zero through diode 38. A negative going zero voltage crossing will not reset counters 45 and 46.

Consider first the operation of up/down counter 45 which is associated with sense winding 51 of rod 22. Assume that flip-flop 52 is in its set condition prior to time $t_{01}$ of FIG. 6. As the triangular shaped waveform 38 passes the zero reference line 39 at time $t_{01}$ in a positive direction and the output of square wave generator 87 becomes positive, AND gate 55 of FIG. 5 will be primed to pass pulses from clock pulse source 61. Also at time $t_{01}$ of FIG. 6, during the positive zero crossing, the detector 86 of FIG. 5 supplies a positive pulse 29 (FIG. 6) through diode 38 which resets up/down counters 45 and 46 to zero.

The clock pulse source 61 supplies a train of pulses through enabled AND gate 55 and into up/down counter 45 to cause said counter to count up. At time $t_1$ of FIG. 6 the pulse 36 is generated in sensing winding 51 of FIG. 5 as the rod 22 is switched to its upper level. Such positive pulse resets flip-flop 52 to disable AND gate 55 and partially prime AND gate 56. Thus, the up/down counter 45 ceases counting up. No further counting will occur in counter 45 until AND gate 56 is fully primed which will occur when the triangularly shaped waveform 38 of FIG. 6 becomes negative and the square wave output of generator 87 assumes its lower level. Such lower level will be inverted by inverter 58 of FIG. 5 to fully prime AND gate 56 so that clock pulses from source 61 will pass therethrough and into the counter 45 to cause said counter to count down. Such down counting will occur in counter 45 until the occurrence of the negative pulse 41 of FIG. 6 which occurs at time $t_4$ in sensing winding 51 of rod 22. Such negative pulse 41 sets the flip-flop 52 thereby disabling AND gate 56 and terminating the down counting in counter 45. The resultant count in counter 45 is proportional to the time period $t_{i4}$ minus the time period $t_{i1}$ which, in turn, is proportional to $2H_E \sin \Theta_1$ as shown in expression (c) above. The latch 57 at all times contains the current count in counter 45 and accordingly will retain the final count of counter 45.

Consider next the operation of counter 46 and its associated logic which includes AND gates 65 and 66, flip-flop 67, inverter 68 and latch 70.

Assume again that prior to time $t_{01}$ of FIG. 6 the flip-flop 67 of FIG. 5 is in its set condition to prime AND gate 65. As the triangular waveform 38 crosses the zero reference line 39 in a positive direction at time $t_{01}$ and the output of generator 87 assumes its upper level, AND gate 65 is further primed to pass clock pulses from source 61 therethrough to the up/down counter 46 to cause said counter 46 to count upwardly. It will be recalled that at time $t_{01}$ of FIG. 6 when the triangularly shaped waveform 38 crossed the zero reference line 39 in a positive going direction, a pulse 29 was supplied from zero crossing detector 86 through diode 38 to set the counter 46 to zero.

At time $t_2$ of FIG. 6 a positive pulse 37 is generated in sensing winding 50 of FIG. 5, which functions to reset flip-flop 67 thereby disabling AND gate 65 and partially priming AND gate 66. However, no pulses will pass through AND gate 66 since the output from square wave generator 87 to FIG. 5 is inverted by inverter 58 to supply a negative voltage to an input of AND gate 66.

However, at time $t_{02}$ the triangular waveform 38 of FIG. 6 goes negative and generates pulse 90 to cause the output of square wave generator 87 assume its lower level and therefore the output of inverter 58 becomes positive. AND gate 66 becomes fully primed to pass the output of pulses from clock pulse 61 therethrough to counter 46 to cause it to count downwardly until the occurrence of the negative pulse 40 at time $t_3$ of FIG. 6 which occurs in sensing winding 50 to set flip-flop 67 through inverter 68, thereby disabling AND gate 66. Thus, the counter 46 contains a resultant count proportional to the difference between time intervals $t_{i3}$ and $t_{i2}$ of FIG. 6 which, in turn, is proportional to $2H_E \cos \Theta_1$ as indicated in expression (f) above. The latch 70 contains the final count of counter 46.

The value of $\Theta_1$ is computed by the logic within block 71 which functions to determine the arc tangent of $\Theta_1$ which is equal to the count in latch 57 divided by the count in latch 70 after all counting functions in the cycle have been completed, and as indicated in expression (g) above. Specifically, such computation of $\Theta_1$ within block 71 is accomplished upon energization of NAND gate 74 which occurs when three conditions are met. Such conditions include the disabling of both AND gates 56 and 66 and the existence of a negative output from the waveform generator 87, thus assuring that the computation of $\Theta_1$ occurs after the last pulse 41 at time $t_4$ in FIG. 6 has occurred. A delay means 75 is provided between waveform generator 87 and NAND gate 74 to prevent a race condition in which NAND gate 74 could produce an output at time $t_{02}$ before AND gates 56 and 66 were disabled by the negative output of waveform generator 87. It is to be noted that in expressions (c) and (f) both $2H_E \sin \Theta_1$ and $2H_E \cos \Theta_1$ are positive quantities, thereby defining the direction of the earth's magnetic field $H_E$ to be in the northeast quadrant of FIG. 4.

Figure 9:
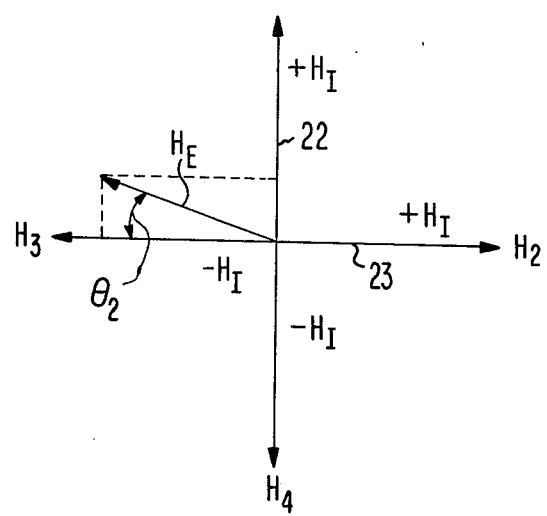
FIG. 9 shows the angular waveform of the earth's magnetic field to the two crossed rods whose BH curves are represented by the waveforms of FIGS. 7 and 8.

FIG. 9 shows a situation where the earth's magnetic field $H_E$ lies in the northwest quadrant of the vector diagram where rod 22 again is shown in a vertical position and rod 23 in a horizontal position. FIGS. 7 and 8, respectively, show the BH curves of rod 22 and rod 23 as they are affected by the earth's magnetic field in accordance with the vector diagram of FIG. 9.

The values of $H_1$, $H_2$, $H$ and $H$ are given in the following expressions:

$$H_1 = H_I - H_E \sin \Theta_2 = \alpha t'_{i1} \qquad (k)$$

$$H_2 = H_I + H_E \cos \Theta_2 = \alpha t'_{i2} \qquad (l)$$

$$H_3 = H_I - H_E \cos \Theta_2 = \alpha t'_{i3} \qquad (m)$$

$$H_4 = H_I + H_E \sin \Theta_2 = \alpha t'_{i4} \qquad (n)$$

where $\alpha$ is a constant.

As in the case of the example of FIG. 4, the values of $H_1$, $H_2$, $H_3$ and $H_4$ of FIG. 9 are proportional, respectively, to the time intervals $t'_{i1}$, $t'_{i2}$, $t'_{i3}$ and $t'_{i4}$ as shown in the waveform of FIG. 6.

In the example of FIGS. 7-9 it will be noted that rod 23 is biased in the direction of its negative magnetization by a value equal to $H_E \cos \Theta_2$ so that the coercive force $H_3$, shown in FIG. 8 and expression (m) above, required to switch rod 23 to its lower level is very small, whereas the coercive force required to switch rod 23 to its higher level $H_2$ is quite large, as indicated by expression (l) above.

In FIG. 6, beginning at the positive crossover time $t_{03}$, it can be seen that rod 22 (FIG. 9) is switched to its upper level first at time $t'_1$, generating positive pulse 44, then rod 23 is switched to its upper level at time $t'_2$, generating positive pulse 85, followed by the switching of rod 23 to its lower level at time $t'_3$ generating negative pulse 47, and finally the switching of rod 22 to its lower level at time $t'_4$, generating negative pulse 48. The up/down counters 45 and 46 of FIG. 5 perform the same functions as discussed in connection with the example of FIGS. 1-4 to take the difference of time periods $t'_{i4}$ and $t'_{i1}$ and also the difference of time periods $t'_{i3}$ and $t'_{i2}$ which are respectively proportional to $+2H_E \sin \Theta_2$ and $-2H_E \cos \Theta_2$ as, shown in the following expressions:

$$\alpha t'_{i4} - \alpha t'_{i1} = (H_I + H_E \sin\theta_2) - (H_I - H_E \sin\theta_2) = \qquad (o)$$
$$+2H_E \sin\theta_2$$
$$\alpha t'_{i3} - \alpha t'_{i2} = (H_I + H_E \cos\theta_2) - (H_I + H_E \cos\theta_2) = \qquad (p)$$
$$-2H_E \cos\theta_2$$

The negative polarity of $2H_E \cos \Theta_2$ and the positive polarity of $+2H_E \sin \Theta_2$ place the vector $H_E$ of FIG. 9 in the northwest quadrant. These polarity signs are reflected in the final counts of counters 45 and 46. The computer 71 interprets the counts in counters 45 and 46, which also appear in latches 57 and 70, not only to compute $\Theta_2$ but also to identify the quadrant in which the earth's magnetic field vector $H_E$ lies, that is, its relationship to the position of the rods 22 and 23 of FIG. 5.

Specifically, a resultant positive count in the counter 45 of FIG. 5 indicates that vector $H_E$ of FIG. 9 lies either in the southwest or southeast quadrant of FIG. 9 whereas a negative resultant count in counter 45 indicates that vector $H_E$ lies in the northeast or northwest quadrant of FIG. 9. Similarly, a positive resultant count in counter 46 indicates that vector $H_E$ lies in the northwest or southwest quadrant of FIG. 9 and a negative resultant count in counter 46 indicates that vector $H_E$ lies in the northeast or southeast quadrant of FIG. 9. Thus, the particular quadrant in which vector $H_E$ lies is determined by the polarities of expressions (o) and (p) above.

It is to be understood that the form of the invention shown and described herein is a preferred embodiment thereof and that various changes can be made therein, particularly in the logic for interpreting the switching points of the two rods, without departing from the spirit or scope of the invention.

For example, waveforms other than triangularly shaped waveforms, such as sine function waveforms can be employed to drive the switching windings on the rods. The recorded counts representing the time intervals of switching between the high and low levels of each rod from zero current crossover points can first be compared with the period of the driving sine wave current and then translated, by suitable logic, into sine functions to determine the relative difference of the amplitudes of the driving current at the two switching points of each rod. The angular relationship of the rods to the external field is equal to the arc tangent of the ratio of such relative differences of amplitudes of the driving currents of the two rods.

What is claimed is:

1. Magnetic field direction indicating means comprising:
   first and second orthogonally positioned rods, each having a rectangularly shaped BH curve and a switching winding wound therearound;
   sensing means for individually sensing a change in polarity of magnetization of said rods;
   second means for supplying an alternating current having a triangularly shaped waveform through said switching windings to switch the polarity of magnetization of said rods between their upper and lower levels; and
   third means for determining the arc tangent of the ratio of the differences in positive and negative currents required to switch each of said rods between its upper and lower levels.

2. Magnetic field direction finding means as in claim 1 in which said third means comprises:
   first time measuring means for determining a first time difference between the time intervals required to shift said first rod to its upper level and to its lower level measured from the immediately preceding zero current crossover points of said alternating current;
   second time measuring means for determining a second time difference between the time intervals required to shift said second rod to its upper level and to its lower level measured from the immediately preceding zero current crossover points of said alternating current; and
   calculating means for determining the arc tangent of the ratio of said first time difference to said second time difference.

3. Magnetic field direction indicating means as in claim 1 in which said third means comprises:
   first logic means comprising first counter means responsive to the magnitude of the positive current required to switch said first rod to its upper level to register a first count proportional to said positive magnitude, and further responsive to the magnitude of the negative current required to switch said first rod to its lower level to register a second count proportional thereto, and further comprising means for producing a first resultant count equal to the difference between said first and second counts;
   second logic means comprising second counting means responsive to the magnitude of the positive current required to switch said second rod to its upper level to register a third count proportional to said positive magnitude, and further responsive to the magnitude of the negative current required to switch said second rod to its lower level to register a fourth count proportional to said negative magnitude, and further comprising means for producing a second resultant count equal to the difference of said third and fourth counts; and
   means for determining the arc tangent of the ratio of said first resultant count to said second resultant count.

4. Magnetic field direction indicating means as in claim 1 in which said sensing means comprises first and second sensing windings wound one each on said first and second rods to sense a change of magnetization from either level to the other level of each rod.

5. Magnetic field direction indicating means comprising:
   a pair of orthogonally positioned rods each having a rectangularly shaped BH curve and a switching winding wound therearound;
   sensing means for individually sensing a change in polarity of magnetization of said rods;
   means for supplying an alternating current waveform through said switching windings to switch the polarity of magnetization of said rods between their upper and lower levels; and
   means for determining the ratio of the differences in positive and negative currents required to switch each of said rods between its upper and lower levels.

6. Magnetic field direction indicating means as in claim 5 in which said means for determining the ratio comprises:
   first logic means comprising first counter means responsive to a first magnitude of the positive current required to switch said first rod to its upper level to register a first count having a known relationship to said first magnitude of positive current, and further responsive to a first magnitude of the negative current required to switch said first rod to its lower level to register a second count having a known relationship to said first magnitude of negative currents, and further comprising means for producing a first resultant quantity proportional to the difference between said first magnitudes of positive and negative currents;
   second logic means comprising second counting means responsive to a second magnitude of the positive current required to switch said second rod to its upper level to register a third count having a known relationship to a second magnitude of positive current, and further responsive to a second magnitude of the negative current required to switch said second rod to its lower level to register a fourth count having a known relationship to said second magnitude of negative current, and further comprising means for producing a second resultant quantity proportional to the difference between said third and fourth second magnitudes of positive and negative currents; and means for determining the arc tangent of the ratio of said first resultant quantity to said second resultant quantity.

7. Magnetic field direction indicating means as in claim 5 in which said sensing means comprises first and second sensing windings wound one each on said pair of rods to sense a change of magnetization from either level to the other level of each rod.

8. Means for detecting the direction of a given magnetic field comprising:
first and second rods having rectangularly shaped BH curves and positioned at right angles to each other;
first and second driving windings joined together at first ends thereof and wound around said first and second rods, respectively;
first and second sensing windings wound around said first and second rods, respectively;
means for supplying an alternating current through said first and second windings to switch the magnetization of said rods to their first level during the positive portion of said current and to switch the magnetization of said rods to their lower level during the negative portion of said current;
means for measuring the difference in current magnitudes, measured from the immediately preceding zero voltage crossover points, to shift the magnetization of each of said first and second rods from its upper to its lower level and then back to its upper level again; and
comparing means for comparing the magnitudes of the current differences of each rod to determine the angular relationship between the said given magnetic field and the direction of a selected one of said rods.

9. A system for ascertaining the direction of a particular magnetic field comprising:
first and second orthogonally positioned magnetic rods located in said field, each rod capable of assuming two remanent magnetization states;
means responsive to a common alternating drive current for individually applying to each rod an alternating magnetic field for switching the respective rods between their remanent states;
sensing means for individually sensing the switching between remanent states of each rod;
means for indicating each passage of said common drive current through zero;
means for measuring the time intervals $\Delta t_1$ and $\Delta t_2$ between an indication that the drive current has passed through zero in one sense and the respective times $t_1$ and $t_2$ that the first and second rods switch to one of their remanent states, and the time intervals $\Delta t_3$ and $\Delta t_4$ between an indication that the drive current has passed through zero in the opposite sense and the respective times $t_3$ and $t_4$ that the second and first rods switch to their other remanent state, this time difference being indicative of the direction of said particular magnetic field.

10. Magnetic field direction indicating means comprising:
a pair of orthogonally positioned rods each having a rectangularly shaped BH curve and a switching winding wound therearound;
sensing means for individually sensing a change in polarity of magnetization of said rods;
means for supplying an alternating current waveform through said switching windings to switch the polarity of magnetization of said rods between their upper and lower levels; and
means for determining the ratio of the difference in positive and negative currents required to switch each of said rods from its lower level to its upper level.

* * * * *